United States Patent [19]

Ueno et al.

[11] Patent Number: 4,664,748
[45] Date of Patent: May 12, 1987

[54] SURFACE ROUGHENING METHOD

[75] Inventors: Masakazu Ueno; Toshiaki Kato, both of Yokosuka, Japan

[73] Assignees: Fuji Electric Company Ltd.; Fuji Electric Corporate Research and Development Ltd., both of Japan

[21] Appl. No.: 788,565

[22] Filed: Oct. 17, 1985

[30] Foreign Application Priority Data

Nov. 1, 1984 [JP] Japan .................................. 59-230812

[51] Int. Cl.$^4$ .......................... B44C 1/22; C23F 1/02; C03C 15/00; C03C 25/06
[52] U.S. Cl. ................................. 156/659.1; 156/654; 156/656; 156/657; 156/663; 156/665; 156/904; 430/321; 430/323
[58] Field of Search ............... 156/654, 655, 656, 657, 156/659.1, 661.1, 663, 664, 665, 904; 430/313, 317, 318, 321, 323

[56] References Cited

U.S. PATENT DOCUMENTS 4,407,695 10/1983 Deckman ............................ 156/643
4,532,537 7/1985 Kane .................................... 357/30

OTHER PUBLICATIONS

H. Bohlen et al., Method of Improving the Adhesion of Copper on a Plastic Laminate, IBM Tech. Disclosure Bulletin, vol. 26, No. 2, Jul. 1983, pp. 673-674.

Primary Examiner—William A. Powell
Attorney, Agent, or Firm—Stevens, Davis, Miller & Mosher

[57] ABSTRACT

A surface roughening method, preferably for a substrate of a solar cell, comprising coating the substrate with a photoresist material having light-shielding particles mixed therein, exposing and developing the photoresist coating and then etching the substrate with a suitable etchant.

4 Claims, 8 Drawing Figures

SURFACE ROUGHENING METHOD

RELATED APPLICATIONS

Related applications, are Ser. Nos. 771,623 filed Sept. 3, 1985; 776,670 filed Sept. 16, 1985 and 780,093 filed Sept. 25, 1985.

BACKGROUND OF THE INVENTION

The present invention relates to a surface roughening method, and more particularly to a method of providing an uneven surface for glass and metal plates that may be used as substrates for solar cells.

The concept of "textured cells" was introduced by Wronski et al, with a view to improving photoelectric conversion efficiency of thin-film solar cells using amorphous silicon or other semiconductor materials. According to Wronski's theory, the incident sunlight is caused to deflect by some means and the resulting confinement of the transmitted light is used to increase the amount of photocurrent (see Unexamined Published Japanese Patent Application No. 59-61873, corresponding to U.S. patent application Ser. No. 424,137/1982 now U.S. Pat. No. 4,532,537 issued July 30, 1985).

Exemplary solar cells utilizing the confinement of incident light are shown in FIG. 2. The cell shown in FIG. 2a consists of a glass plate 11, one major surface of which is textured and overlaid with a transparent electrode 12, an amorphous silicon (a-Si) layer 13 having a p-i-n junction and a back metal electrode 14, in the order written. The sunlight 17, falling perpendicularly on the glass plate 11, deflects at the interface betweend the substrate and the transparent electrodes 12, and the light having longer wavelengths that has transmitted through the amorphous silicon layer 13 impinges on the interface between this amorphous silicon layer and the back electrode 14 at a large angle of incidence, and resulting enhanced reflectance at this interface allows a greater amount of light to be absorbed by the amorphous silicon layer.

The cell illustrated in FIG. 2b uses a textured metal substrate 15, rather than the textured glass plate 11 and, on this metal substrate, an amorphous silicon layer having a p-i-n junction, a transparent electrode 12 and a collector electrode 16 are deposited, in the order written. In this case, the incident sunlight is effectively confined in the amorphous silicon layer 13 by entirely the same mechanism as explained for FIG. 2a. The cell shown in FIG. 2c has the same construction as that of the cell in FIG. 2a, except that the glass plate 11 has no textured surface and, instead, the transparent electrode 12 is provided with a textured surface.

Conventionally, the surfaces of glass plates, metal plates, etc., are roughened either by using abrasives or by using more efficient (faster) chemical etching techniques, providing natural-looking uneven surfaces. However, it is very difficult to implement either method while ensuring precise control over the size and height of the projections on the roughened surface.

SUMMARY OF THE INVENTION

The principal object, therefore, of the present invention is to provide a surface roughening method that is capable of providing an uneven surface for a substrate with a high degree of controllability and by means of simple procedures.

In accordance with the present invention, this object can be achieved by first coating the surface of a substrate of interest with a photoresist, incorporating light-shielding micro particles, and after exposing and developing the photoresist, the substrate is etched with an etchant capable of etching the material of which the substrate is made.

DESCRIPTION OF A PREFERRED EMBODIMENT

FIG. 1 shows schematically the sequence of steps that are followed to implement the process of the present invention in accordance with a preferred embodiment. First, a positive-working photoresist (e.g., OFPR 800 of Tokyo Ohka Kogyo Co., Ltd.) 1 is mixed with hyperfine particles of carbon black (e.g., Ketchen Black of Lion Corporation or EP-1300 of Cabot Corporation, USA) 2 and the mixture is applied to a glass plate 3 to give a coat having a thickness of about 1 $\mu$m (FIG. 1a). As a result of subsequent exposure and development steps, only those parts of the resist 1 which have been shielded from light by the carbon black particles 2 are left intact, as shown in FIG. 1b. Then, the surface of the glass plate is etched with hydrofluoric acid, as shown in FIG. 1c, producing a glass surface upon which multiply cylindrical glass columns are dispersed, as shown in FIG. 1d. A plasma-assisted etching in a mixture of $O_2$ and $CF_4$ gases may be employed if the resist used has high plasma resistance. The photoresist material must be one which will not react with the etchant.

As will be understood from the foregoing description, the size of glass columns is determined by the sizes of hyperfine carbon black particles, whereas the height of columns is dictated by the duration of etching. Therefore, by properly controlling these two parameters, an uneven surface having the desired degree of roughness may be produced with high accuracy.

In accordance with another embodiment of the present invention, the claimed method may be applied for the purpose of making a plate having a precisely controlled roughness. First, a sintered aluminum plate is coated with an approximately 20 $\mu$m thick photoresist layer incorporating silver glass beads (product of Toshiba-Ballotini Co., Ltd.) having a diameter of 10 $\mu$m. The photoresist coat is subsequently exposed, developed and etched by the same procedures as used in the first embodiment.

Figure 3:
FIG. 3 is a plan view of a glass plate carrying characters whose surfaces have been roughened in accordance with another embodiment of the present invention.

FIG. 3 shows a still further embodiment of the present invention, wherein the claimed method, characterized by low cost, is applied to the making of an ornamental article. A mirror-surfaced stainless steel plate 5 is first coated with a photoresist layer incorporating carbon black particles. Then, the photoresist coat is exposed, with a photomask carrying desired characters or patterns being placed on it. By subsequent development and etching procedures, a plate carrying decorative characters 6 with roughened surfaces is obtained.

Figure 1A:
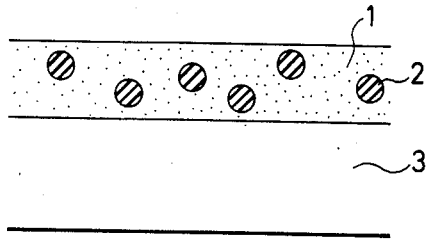
FIG. 1 shows the sequence of steps for implementing the method of the present invention in accordance with one embodiment, (a) to (c) being cross-sections and (d) being a perspective view.
Figure 1B:
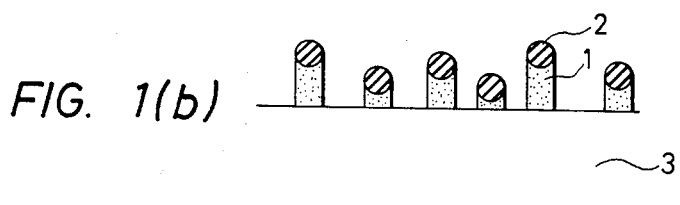
Figure 1C:
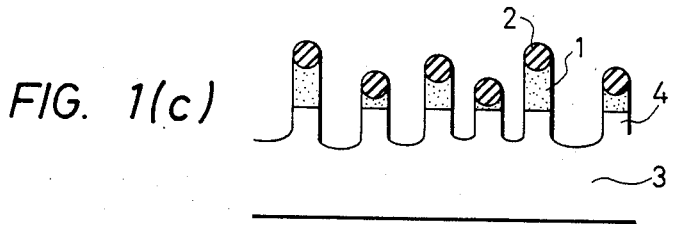
Figure 1D:
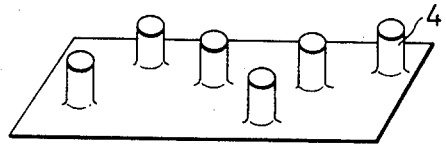
Figure 2A:
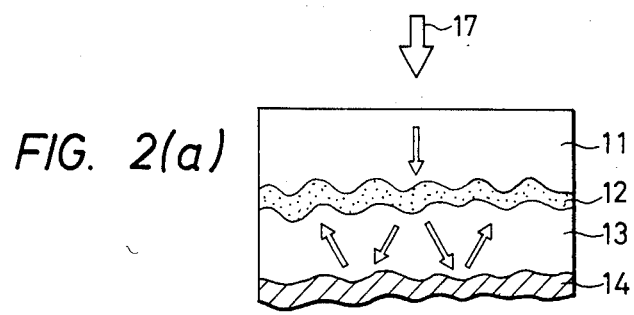
FIG. 2 shows, in cross-section, three constructions of a solar cell to which the method of the present invention is applicable.
Figure 2B:
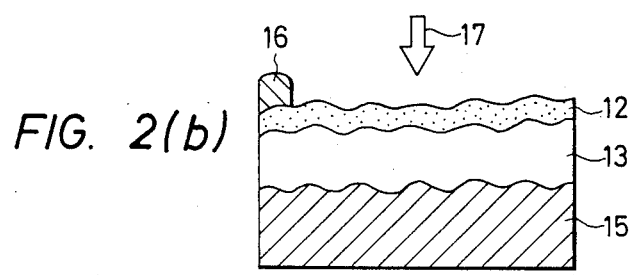
Figure 2C:
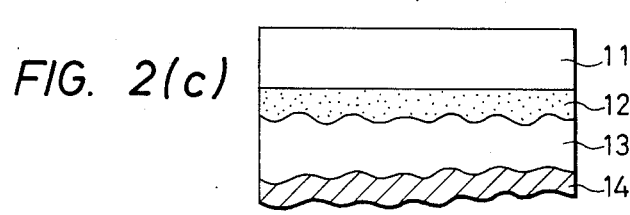

The method of the present invention may also be used for the purpose of making a transparent electrode which, as shown in FIG. 2c, has a roughened surface and is deposited on a smooth-surfaced glass plate. The applicability of this method is not limited to the making of textured substrates for solar cells, polished plates and decorative plates described in the three embodiments, and it may find many other uses. The light-shielding micro-particles are not limited to carbon black particles and glass beads. It is also to be understood that if a negative-activing photoresist is used, grooves with a controlled depth are formed in those areas which have been shielded from light, and the substrate carrying the resulting photoresist pattern is subsequently etched to provide a roughened surface.

In accordance with the present invention, a photoresist incorporating light-shielding micro-particles is coated onto the surface of a substrate of interest, and after exposure to the conventional photoetching step. By these procedures, selected regions of the substrate can be easily roughened with high accuracy in control over the degree of surface roughness. The method of the present invention is effective for enhancing the efficiency of a solar cell by properly controlling the refraction and reflection of light falling upon the cell. The method is also applicable to the purpose of roughening a variety of substrates, and this suggests the great commercial value of the method.

We claim:

1. A surface roughening method, comprising the following steps:
    coating the surface of a piece of glass with a photoresist incorporating light-shielding micro-particles;
    exposing and developing the photoresist coat; and
    etching the substrate with hydrofluoric acid capable of etching the glass, but not etching the undeveloped photoresist behind the light-shielding particles.

2. The method of claim 1 in which the photoresist is a positive working photoresist material having a thickness of about 1 $\mu$m.

3. A surface roughening method, comprising the following steps:
    coating the surface of a piece of aluminum with a photoresist incorporating light-shielding microparticles of silver glass beads having a diameter of about 10 $\mu$m;
    exposing and developing the photoresist coat; and
    etching the aluminum with an etchant capable of etching the aluminum, but not etching the undeveloped photoresist behind the light-shielding particles.

4. A method of roughening the surface of a piece of glass, comprising:
    coating said glass surface with a coat having a thickness of about 1 $\mu$m with a positive working photoresist material, said material having mixed therein light-shielding particles and being non-reacting with hydrofluoric acid;
    exposing the coating to light for a sufficient time to react with the photoresist material so that only the portions behind the light-shielding particles remain unexposed;
    developing the photoresist material; and
    etching the surface of the glass with hydrofluoric acid for a sufficient time to react with that portion of the glass surface not covered by the light-shielding particles to produce a glass surface upon which multiple cylindrical glass columns are dispersed in location corresponding to the locations of the light-shielding particles.

* * * * *